United States Patent [19]

Tsuno

[11] Patent Number: 4,585,942

[45] Date of Patent: Apr. 29, 1986

[54] TRANSMISSION ELECTRON MICROSCOPE

[75] Inventor: Katsushige Tsuno, Tokyo, Japan

[73] Assignee: Jeol Ltd., Tokyo, Japan

[21] Appl. No.: 584,712

[22] Filed: Feb. 29, 1984

[30] Foreign Application Priority Data

Mar. 17, 1983 [JP] Japan .................................. 58-45064
Oct. 6, 1983 [JP] Japan .................................. 58-187392

[51] Int. Cl.⁴ .......................... G21K 1/08; H01J 37/00
[52] U.S. Cl. ............................................. 250/396 ML
[58] Field of Search ...................... 250/396 ML, 356 R

[56] References Cited

U.S. PATENT DOCUMENTS 3,851,172 11/1974 Ozasu et al. ................. 250/396 ML
4,306,149 12/1981 Le Poole et al. ............ 250/396 ML

FOREIGN PATENT DOCUMENTS 0013648  2/1981 Japan ........................... 250/396 ML
0128541 10/1981 Japan ........................... 250/396 ML
0080645  5/1982 Japan ........................... 250/396 ML
2087138  5/1982 United Kingdom ........ 250/396 ML Primary Examiner—Bruce C. Anderson
Attorney, Agent, or Firm—Webb, Burden, Robinson & Webb

[57] ABSTRACT

A transmission electron microscope having objective lens comprising upper, middle and lower magnetic pole pieces installed inside a yoke enveloping the first and second excitation coils. The polarity of the first magnetic field between the upper and middle magnetic pole piece is changed according to the selection of the two observation modes for an electron microscope image and for a converged beam diffraction pattern. However, the position of a specimen located at the midst of the second magnetic field between the middle and lower magnetic pole pieces is fixed during said two operation modes, so that analysis for a crystalline material of a very small area in the specimen is carried out by easy operation.

8 Claims, 5 Drawing Figures

TRANSMISSION ELECTRON MICROSCOPE

BACKGROUND OF THE INVENTION

This invention relates to a transmission electron microscope having an objective lens equipped with three magnetic pole pieces.

Analysis for a very narrow area in a thin crystalline specimen by using a transmission electron microscope is carried out as follows.

First, the electron microscope is operated at an electron microscope (EM) mode. In this EM mode, the collimated beam of electrons irradiates the comparatively wide area on a specimen, and the electron microscope image of the specimen is displayed on a fluorescent screen by adjusting an image forming lens system. And the specimen is moved by a specimen positioning means so that the desired point (or very narrow area) to be analyzed in the field of the electron microscope image is displayed on the center of the fluorescent screen.

Next, the operation mode is changed to a convergent beam electron diffraction (CBED) mode. In this CBED mode, the electron beam is converged at said vary narrow area on the specimen by adjusting a condenser lens system, and the diffraction pattern is formed on the fluorescent screen by adjusting the image forming lens system. Analysis of this diffraction pattern makes it possible to precisely analyze the crystal structure of the material, to identify the material name, and to determine the orientation of the crystalline material.

It is theoretically possible to change the EM and CBED modes only by adjusting the condenser lens system and image forming lens system respectively. However, in the conventional electron microscope in which the specimen is located in the midst of the objective lens field, adjustment of the focusing lens system is followed by the change in the condenser lens system. Accordingly, it is further necessary to shift the specimen position along the optical axis for changing said EM and CBED modes. This operation of specimen shift is troublesome and requires some prudence and long operation time.

An object of the invention is to provide a transmission electron microscope capable of overcoming the above disadvantages so as to facilitate the change of the EM and CBED modes without specimen shift.

SUMMARY OF THE INVENTION

Briefly according to this invention, a transmission electron microscope is provided with the objective lens equipped with upper, middle and lower magnetic pole pieces. These magnetic pole pieces are installed inside a ferromagnetic yoke enveloping first and second excitation coils so that first magnetic field in the upper gap between said upper and middle magnetic pole pieces is generated by means of said first excitation coil and its first lens power supply and second magnetic field in the lower gap between said middle and lower magnetic pole pieces is generated by said second excitation coil and its second lens power supply. A specimen is located in the midst of the lower magnetic field. And the polarity of said first magnetic field is changed by a polarity control means at the change of said EM and CBED modes.

DESCRIPTION OF THE PREFERRED EMBODIMENT

Figure 1:
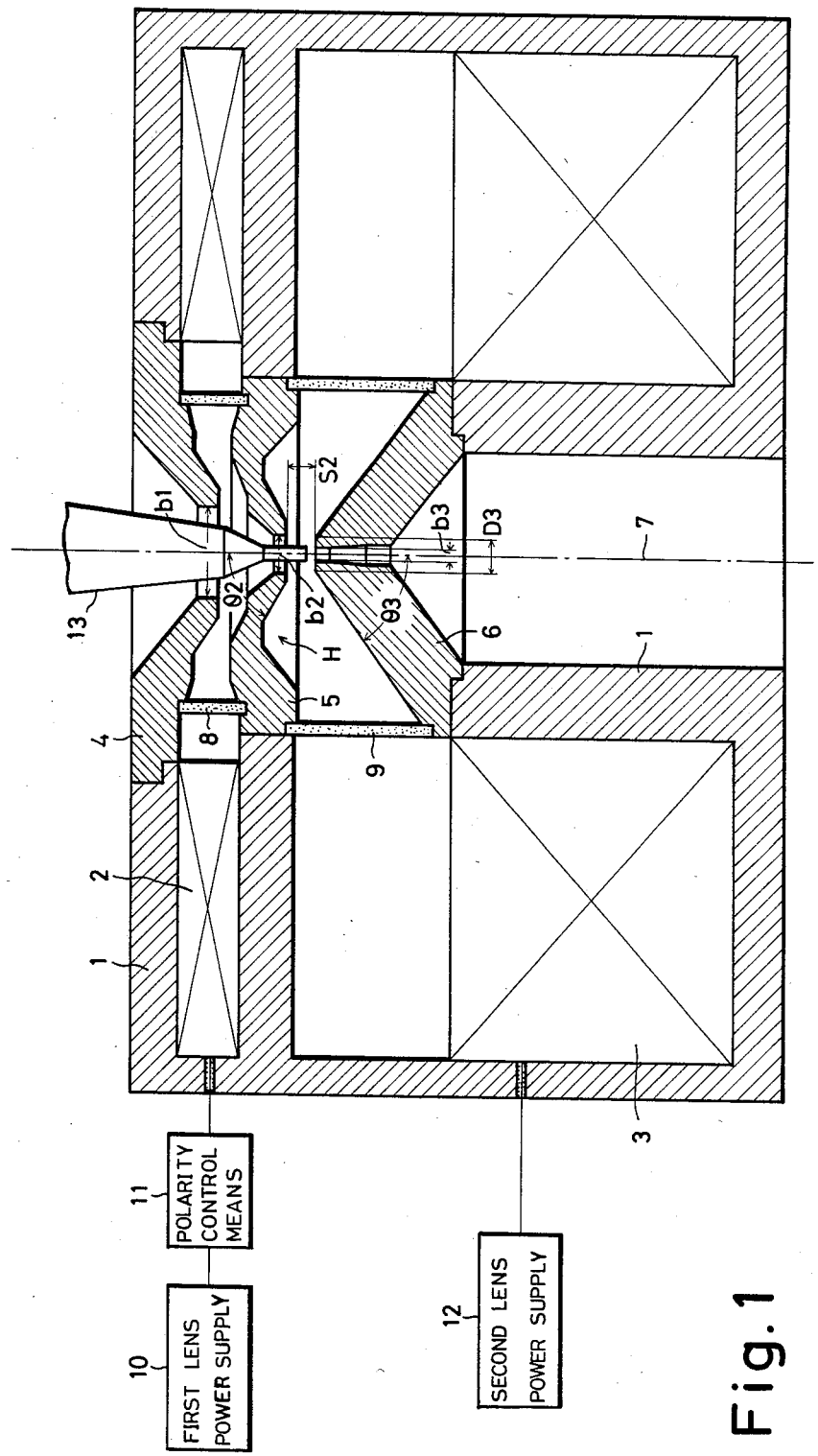
FIG. 1 is a schematic drawing showing an essential part of one embodiment according to the invention.

FIG. 1 is a cross-sectional drawing of the objective lens used in a transmission electron microscope according to this invention. A ferromagnetic yoke 1 envelopes a first excitation coil 2 and a second excitation coil 3, respectively. The three inner ends of yoke 1 contact with the upper, middle and lower magnetic pole pieces 4, 5 and 6 arranged symmetrically with respect to an electron optical axis 7. Two pipe-shaped and non-ferromagnetic spacers 8 and 9 connect the three pole pieces for ensuring the precision of positional relation between the three magnetic pole pieces. The first excitation coil 2 is supplied with current from a first lens power supply 10 via polarity control means 11 so that the first (magnetic lens) field is generated in the upper gap between the upper and middle magnetic pole pieces 4 and 5, and the second excitation coil 3 is supplied with current from a second lens power supply 12 so that the second (magnetic lens) field is generated in the lower gap between the middle and lower magnetic pole pieces 5 and 6. A specimen (not shown) is held in the bottom of a nonferromagnetic specimen holder 13, which is moved upward from the position shown in the figure and taken out into the atmosphere for specimen exchange. In the condition that the specimen holder 13 is located at the vertical position shown in the figure, the specimen holder 13 may be shifted perpendicularly to the optical axis 7 by a specimen positioning means (not shown). Further, the specimen may be tilted inside the specimen holder 13 about the tilting axis, which is perpendicular to the optical axis 7, by said specimen positioning means.

The bore diameters b1, b2 and b3 of the upper, middle and lower magnetic pole pieces satisfy the relation b1>b2>b3, so as to enlarge the shifting range of the nearly cone-shaped specimen holder 13. And the lens field generated in the lower gap is used substantially as an objective lens. Accordingly, the following equations (1) are satisfied so as to reduce the coefficient of the spherical aberration Cs and coefficient of chromatic aberration Cc of the substantial objective lens.

$$b2>S2,\ b2>D3,\ 50°\leq\theta_3\leq 70° \tag{1}$$

where, S2 represents the lower gap length, D3 represents the diameter of the top circular plane of the lower magnetic pole pieces 6, and $\theta_3$ represents the angle formed by upper side plane of the lower magnetic pole piece 6 and the optical axis 7. The above equations (1) are obtained by considering the various conditions and the teachings of U.S. Pat. No. 3,585,546.

The middle magnetic pole piece 5 has a ring-shaped hollow H on its lower side in order to satisfy the following three conditions:

(a) The condition of the following equation (2) is required for converging the electron beam effectively at the specimen by the lens field generated in the lower gap.

$$60° \leq \theta_2 \leq 80° \quad (2)$$

where, $\theta_2$ represents the angle formed by the lower side plane of the middle magnetic pole piece 5 and the optical axis 7. The above equation (2) is obtained by considering the various conditions.

(b) The specimen held in the bottom of the specimen holder 13 is located at the midst of the lower gap. And it is preferable to shorten the height of the specimen holder 13 so as to increase quake-resistance of the specimen (vibration resistance of the holder). Accordingly, it is required to design the middle magnetic pole piece 5 as high as possible.

(c) In the case that the first and second magnetic fields are of the same polarity, the direction of the magnetic flux $\phi_1$ flowing through the middle magnetic pole piece 5 due to the first excitation coil 2 is the inverse direction of the magnetic flux $\phi_2$ flowing through the magnetic pole piece 5 due to the second excitation coil 3, so that the intensity of the total magnetic flux flowing through the middle magnetic pole piece 5 is equal to the difference between the intensities of the fluxes $\phi_1$ and $\phi_2$. On the contrary, in the case that the first and second magnetic field are of the inverse polarity with each other, the directions of the magnetic fluxes $\phi_1$ and $\phi_2$ are of the same, so that the intensity of the total magnetic flux flowing through the middle magnetic pole piece 5 is equal to the sum of intensities of the fluxes $\phi_1$ and $\phi_2$. Accordingly, it is necessary to increase the thickness of the middle magnetic pole piece 5 for preventing or decreasing the influence due to the magnetic saturation in the middle magnetic pole piece 5.

Figure 2:
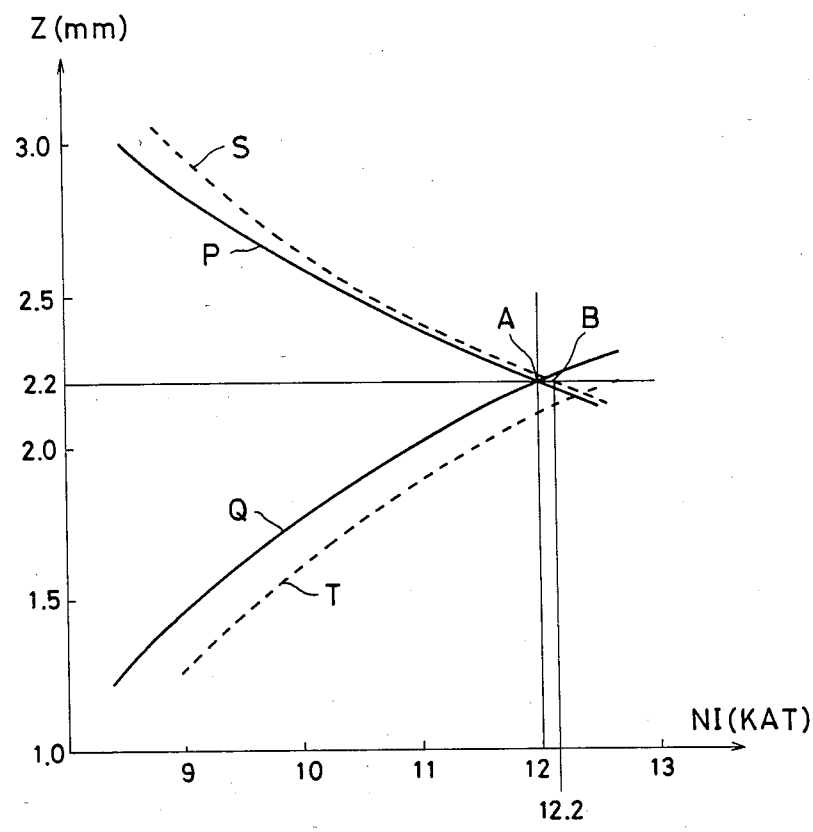
FIG. 2 is a graph for explaining the function of the embodiment shown in FIG. 2.

FIG. 2 shows the graph for explaining the function of the objection lens shown in FIG. 1. In FIG. 2, abscissa represents excitation value of NI (KAT: kilo ampere turns) of the second magnetic field, and ordinate represents the distance Z (mm) between the specimen 15 and the top circular plane of the lower magnetic pole piece 5. All curves shown in FIG. 2, are obtained under the condition that the electron beam accelerating voltage is 200 KV and the strength of the first magnetic field is fixed at 5000 AT. The curves P and Q are obtained under the condition of the same polarity of the first and second magnetic field, and the curves S and T are obtained under the condition of inverse polarity of the first and second magnetic field. And the curves P and S indicate the relation between Z and NI for forming the electron microscope image or the diffraction pattern on the fluorescent screen, and the curves Q and T indicate the relation between Z and NI for converging the electron beam at the specimen. The shifts of curves (P→S, Q→T) are caused by the following two reasons (d) and (e):

(d) The magnetic lens field generated in the lower gaps leaks to the magnetic lens field generated in the upper gap. As a result, in the case that the first and second magnetic field are of the same polarity, the intensity of the first magnetic field is increased. On the contrary, in the case that the first and second magnetic field are of the inverse polarity with each other, the intensity of the first magnetic field is decreased.

(e) The magnetic saturation in the magnetic pole piece 5 is unavoidable when the polarity of the first magnetic field is changed inversely to that of the second magnetic field as mentioned in said condition (c). And, the excitation value necessary for generating the magnetic field having certain intensity under the condition influenced by the magnetic saturation is larger than that under the condition without any influence of the magnetic saturation.

Figure 3A:
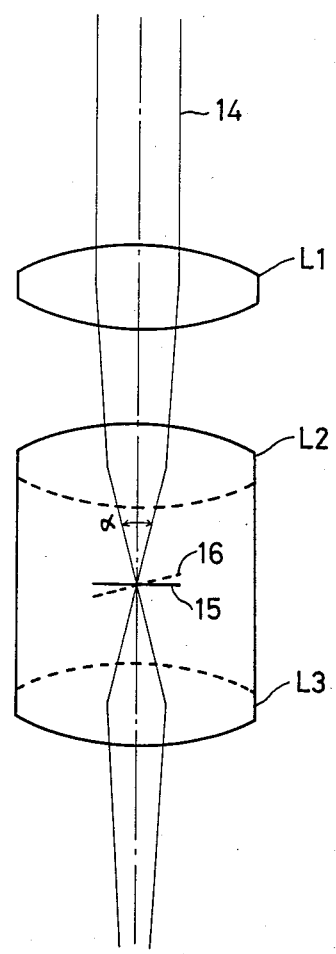
FIGS. 3(a)–(b) is a schematic diagram showing the electron beam paths in the embodiment shown in FIG. 1.

A crossing point A of the curves P and Q in FIG. 2, indicates the condition (I) that the first and second magnetic field are of the same polarity and NI=12.0 KAT and Z=2.2 mm. In this condition (I), the CBED pattern is displayed on the fluorescent screen by controlling the image forming lens system (not shown). FIG. 3(a) shows the schematic diagram of the electron beam path in the objective lens field in this CBED mode. In FIG. 3(a), the electron beam 14 incident upon the first magnetic lens field L1 is paralleled by the condenser lens system, and then converged at the specimen 15 by the first magnetic lens field L1 and apparent front magnetic lens field L2 formed in the lower gap of the objective lens. As a result, the angle $\alpha$ of the cone of the electron beam in the converged spot on the specimen becomes about 10 m rad. (In the other electron beam diffraction pattern modes, the almost paralleled electron beam irradiates the specimen under the condition of $\alpha < 1$ m rad.) The electron beam transmitted through the very small area of the specimen 15 forms the electron microscope image on the objective plane of an intermediate lens part of the image forming lens system by an apparent back magnetic lens field L3 formed in the lower gap of the objective lens, so that the CBED pattern is formed on the fluorescent screen by controlling the image forming lens system.

Figure 3B:
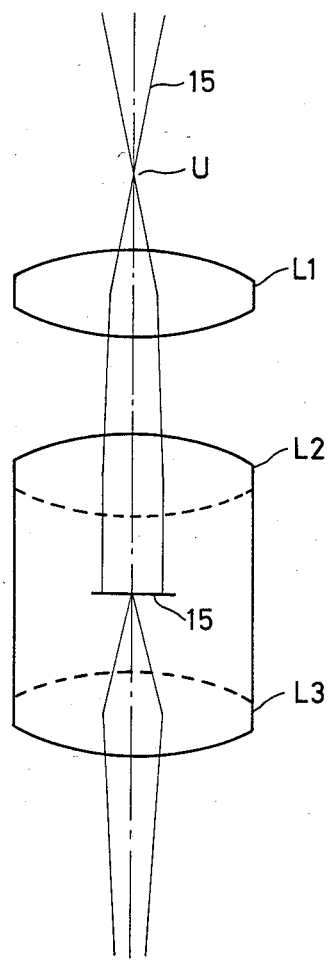

A point B shown in FIG. 2 indicates the condition (II) that the electron microscope image is displayed on the fluorescent screen by controlling the image forming lens system. In the condition (II), the polarity of the first magnetic field is changed by the polarity control means 11 from the condition (I), and the value of NI is varied to 12.2 KAT whereas the Z=2.2 mm is maintained as same as the condition (I). FIG. 3(b) shows the schematic diagram of the electron beam path in the objective lens field in the condition (II) for obtaining EM mode. In FIG. 3(b), the electron beam 14 is converged at a point U by the condenser lens system, and then irradiates the specimen 15 in parallel by the first magnetic lens field L1 and the front magnetic lens field L2. The electron beam transmitted through the comparatively wide area of the specimen 15 forms the electron microscope image on the objective plane of the intermediate lens by the apparent back magnetic lens field L3 formed in the lower gap of the objective lens, so that the electron microscope image is formed on the fluorescent screen by controlling the image forming lens system.

Figure 4:
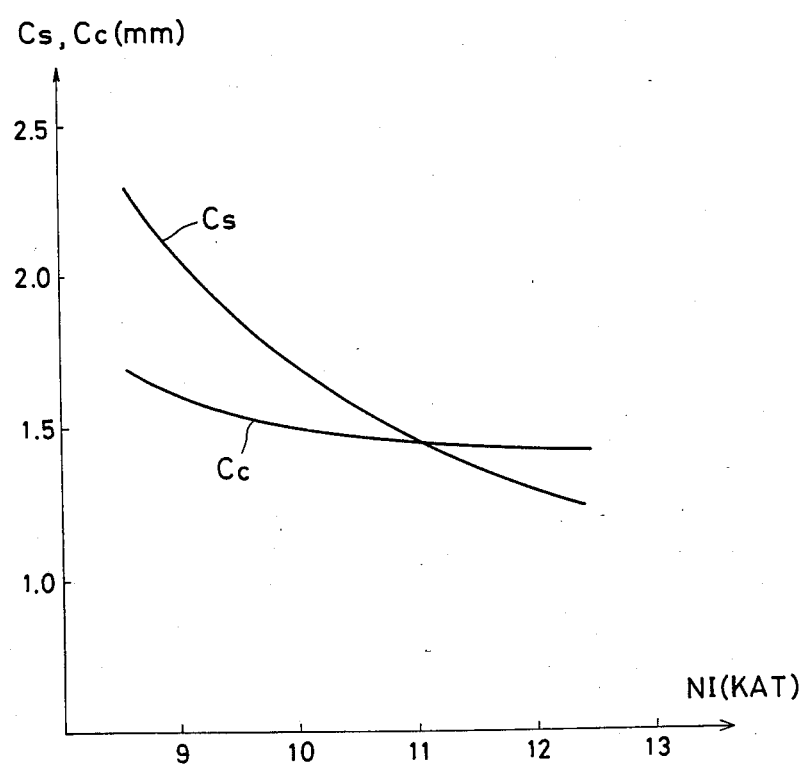
FIG. 4 is a graph showing the relation between the coefficients of the spherical and chromatic aberrations of the objective lens and the excitation of the objective lens in the embodiment shown in FIG. 1.

FIG. 4 shows the graph showing the relation between the excitation value NI (KAT) of the second magnetic field and the coefficients of the spherical and chromatic aberrations Cs and Cc (mm) of the single objective lens composed of the three magnetic lens fields L1, L2 and L3. The curves of Cs and Cc are obtained under the condition that the electron beam accelerating voltage is 200 KV and the strength of the first lens magnetic field is fixed at 5000 AT and the first and second magnetic field are of the same or inverse polarity with each other (under this condition, the curves P and Q or S and T shown in FIG. 2 are obtained). From the curves Cs and Cc shown in FIG. 4, it is known that the coefficients of the spherical and chromatic aberration are sufficiently low value in comparison with that of the conventional electron microscope.

In order to observe the crystalline specimen by using the electron microscope having the objective lens shown in FIG. 1, the first and second lens power supplies 10 and 12 and the polarity control means 11 are operated so that the condition corresponding to point B shown in FIG. 2 is satisfied, and the image forming lens system is controlled for EM mode at first. In this EM mode, the specimen positioning means is adjusted so that the desired area (or point) to be analyzed in the electron microscope image displayed on the fluorescent screen is located at the optical axis 7 (or the center of the fluorescent screen). Next, the polarity control means 11 and the second lens power supply 12 are operated so that the condition corresponding to point A shown in FIG. 2 is satisfied, and the image forming lens system is changed to CBED mode. In this CBED mode, the crystalline specimen 15 is tilted by the optimum angle in the optimum orientation by adjusting the specimen positioning means as shown by the broken line 16 in FIG. 3(a), so that the desired CBED pattern is displayed on the fluorescent screen.

Having thus described the invention with the detail and particularity required by the Patent Laws, what is desired protected by Letters Patent is set forth in the following claims.

I claim:

1. A transmission electron microscope having EM and CBED modes comprising objective lens comprising upper, middle and lower magnetic pole pieces installed inside a yoke enveloping the first and second excitation coils so that a first magnetic lens field between said upper and middle magnetic pole pieces is generated by means of said first excitation coils and its first lens power supply and a second magnetic field between said middle and lower magnetic pole pieces is generated by said second excitation coil and its second lens power supply, a specimen holder for locating a specimen in the midst of the second magnetic lens field and means for changing the polarity of said first magnetic field and adjusting the magnetic fields whereby in the EM mode the polarities are opposed and in the CBED mode the polarities are not opposed and in either mode the specimen remains at its fixed location along the optical axis.

2. A transmission electron microscope according to claim 1, wherein the following relationships are satisfied:

$$b1 > b2 > b3, \ b2 > S2, \ b2 > D3, \ 50° \leq \theta_3 \leq 70°$$

where, b1, b2 and b3 are the bore diameters of the upper, middle and lower magnetic pole pieces respectively, S2 is the length of the gap between the middle and lower magnetic pole pieces, D3 is a diameter of the top circular plane of the lower magnetic pole piece, and $\theta_3$ is the angle formed by upper side plane of the lower magnetic pole piece and the optical axis.

3. A transmission electron microscope according to claim 1 wherein the following relationship is satisfied:

$$60° \leq \theta_2 \leq 80°$$

where, $\theta_2$ is the angle formed by the lower side plane of the middle magnetic pole piece and the optical axis.

4. A transmission electron microscope according to claim 2 wherein the following relationship is satisfied:

$$60° \leq \theta_2 \leq 80°$$

where, $\theta_2$ is the angle formed by the lower side plane of the middle magnetic pole piece and the optical axis.

5. A transmission electron microscope according to claim 1 wherein the middle magnetic pole piece has a ring-shaped hollow on its lower side.

6. A transmission electron microscope according to claim 2 wherein the middle magnetic pole piece has a ring-shaped hollow on its lower side.

7. The transmission electron microscope according to claim 3 wherein the middle magnetic pole piece has a ring-shaped hollow on its lower side.

8. A transmission electron microscope according to claim 4 wherein the middle magnetic pole piece has a ring-shaped hollow on its lower side.

* * * * *